United States Patent
Varghese et al.

(10) Patent No.: US 11,404,314 B2
(45) Date of Patent: Aug. 2, 2022

(54) METAL LINE PATTERNING

(71) Applicant: Applied Materials, Inc., Santa Clara, CA (US)

(72) Inventors: Sony Varghese, Manchester, MA (US);
M. Arif Zeeshan, Manchester-by-the-sea, MA (US);
Shantanu Kallakuri, Ithaca, NY (US);
Kelvin Chan, San Ramon, CA (US)

(73) Assignee: Applied Materials, Inc., Santa Clara, CA (US)

( * ) Notice: Subject to any disclaimer, the term of this patent is extended or adjusted under 35 U.S.C. 154(b) by 34 days.

(21) Appl. No.: 17/072,135

(22) Filed: Oct. 16, 2020

(65) Prior Publication Data
US 2022/0122883 A1 Apr. 21, 2022

(51) Int. Cl.
*H01L 21/768* (2006.01)

(52) U.S. Cl.
CPC .... *H01L 21/76879* (2013.01); *H01L 21/7684* (2013.01); *H01L 21/76876* (2013.01)

(58) Field of Classification Search
CPC .......... H01L 21/76879; H01L 21/7684; H01L 21/76876; H01L 45/1691; H01L 21/32; H01L 21/027–0338
See application file for complete search history.

(56) References Cited

U.S. PATENT DOCUMENTS 11,133,248 B2 * 9/2021 Kim .................. H01L 23/528

OTHER PUBLICATIONS

Bin Lung Yu et al. "APF hard mask distortion improvement for high aspect ratio patterning," 3 pages.
Vikram Iyengar et. al. "Collapse-Free Patterning of High Aspect Ratio Silicon Structures for 20nm NAND Flash Technology," ASMC 2015, 5 pages.

* cited by examiner

Primary Examiner — Julia Slutsker
(74) Attorney, Agent, or Firm — KDB Firm PLLC (57) ABSTRACT

Disclosed are approaches for forming a semiconductor device. In some embodiments, a method may include a method may include providing a semiconductor device including plurality of patterning structures over a device stack, each of the plurality of patterning structures including a first sidewall, a second sidewall, and an upper surface. The method may further include forming a seed layer along just the first sidewall and the upper surface of each of the plurality of patterning structures, forming a metal layer atop the seed layer, forming a fill material between each of the plurality of patterning structures, and removing the plurality of patterning structures.

20 Claims, 8 Drawing Sheets

METAL LINE PATTERNING

FIELD OF THE DISCLOSURE

The present disclosure relates to semiconductor devices, and more particularly, to methods for metal line patterning.

BACKGROUND OF THE DISCLOSURE

Traditionally, metal lines in semiconductor devices have been formed by subtractive processes, as well as a damascene process. Metal line widths have been trending towards widths of less than 10 nm. However, as line widths decrease, the cross-sectional area also decreases, causing resistance to increase. Furthermore, metal lines having a seed layer further reduce metal volume and increase resistance. It is with respect to these and other deficiencies of the prior art that the present disclosure is provided.

SUMMARY OF THE DISCLOSURE

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one approach, a method may include providing a semiconductor device including plurality of patterning structures over a device stack, each of the plurality of patterning structures including a first sidewall, a second sidewall, and an upper surface. The method may further include forming a seed layer along just the first sidewall and the upper surface of each of the plurality of patterning structures, forming a metal layer atop the seed layer, forming a fill material between each of the plurality of patterning structures, and removing the plurality of patterning structures.

In another approach, a method of forming a semiconductor device may include providing a plurality of patterning structures over a device stack, each of the plurality of patterning structures including a first sidewall, a second sidewall, and an upper surface. The method may further include forming a seed layer along just the first sidewall and the upper surface of each of the plurality of patterning structures, forming a metal layer atop just the seed layer, and forming a fill material over the plurality of patterning structures and the device stack. The method may further include planarizing the fill material, the metal layer, and the seed layer to remove the metal layer and the seed layer from the upper surface of each of the plurality of patterning structures.

In another approach, a metal line patterning method may include providing a semiconductor device including a plurality of patterning structures over a device stack, each of the plurality of patterning structures including a first sidewall, a second sidewall, and an upper surface. The metal line patterning method may further include forming a metal layer and a seed layer over each of the plurality of patterning structures, planarizing a metal layer and a seed layer to remove the metal layer and the seed layer from the upper surface of each of the plurality of patterning structures, and removing the plurality of patterning structures to form a plurality of fill structures, wherein the metal layer and the seed layer are present along just one sidewall of each of the plurality of fill structures.

BRIEF DESCRIPTION OF THE DRAWINGS

By way of example, embodiments of the disclosure will now be described, with reference to the accompanying drawings, in which.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods and semiconductor devices in accordance with the present disclosure will now be described more fully hereinafter with reference to the accompanying drawings, where embodiments of the methods are shown. The methods and semiconductor devices may be embodied in many different forms and are not to be construed as being limited to the embodiments set forth herein. Instead, these embodiments are provided so the disclosure will be thorough and complete, and will fully convey the scope of the system and method to those skilled in the art.

Figure 1:
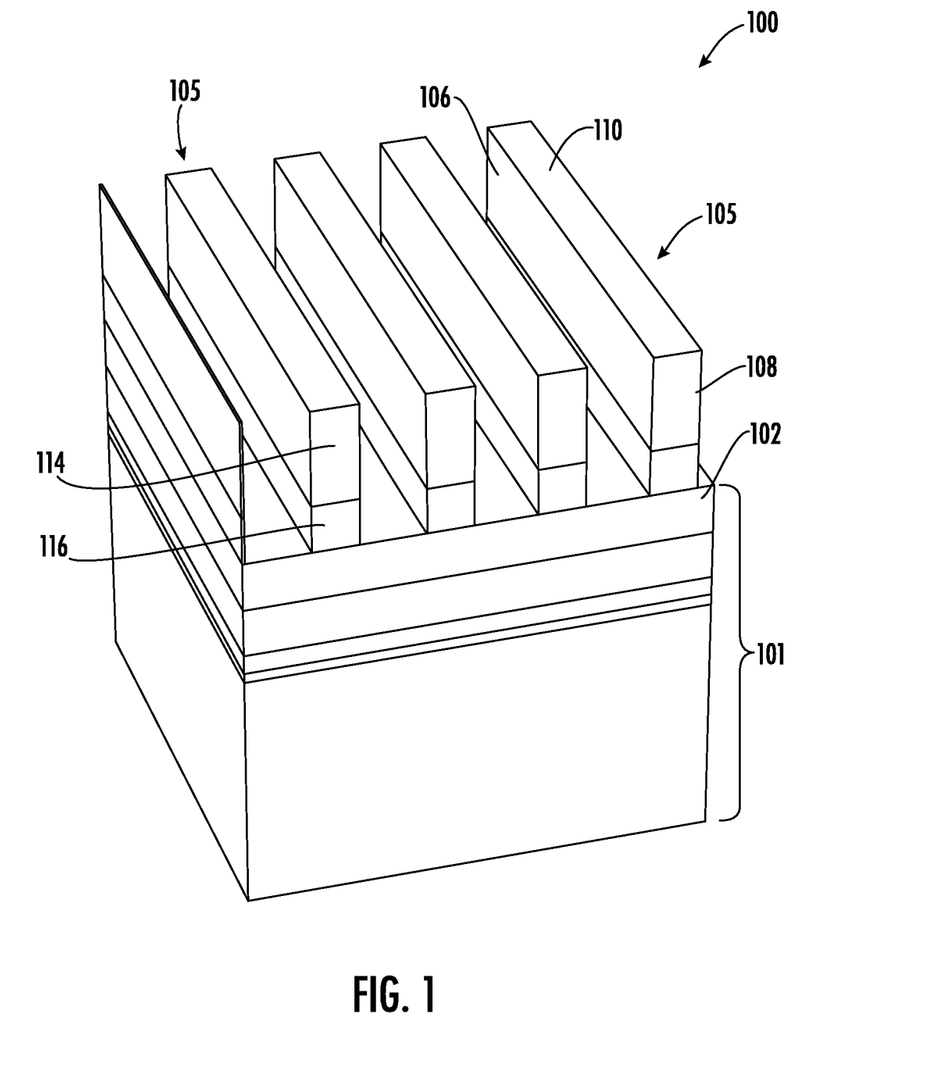
FIG. 1 is a perspective view of a device according to embodiments of the present disclosure.

FIG. 1 depicts a side cross-sectional view of a semiconductor device (hereinafter "device") 100 in accordance with embodiments of the present disclosure. The device 100 may include a device stack 101 and upper device layer 102, which may be a dielectric layer. A plurality of masking or patterning structures 105 may be formed over the device layer 102. As shown, each of the patterning structures 105 may include a first sidewall 106, a second sidewall 108, and an upper surface 110 connecting the first and second sidewalls 106, 108. In some embodiments, the patterning structures 105 may be formed by a relaxed lithography and etch process, wherein the patterning step may involve a self-aligned quadruple patterning (SAQP) process or a selective self-aligned double patterning (SADP) process or any lithography process that may be at a lower resolution than the desired final structure. Although non-limiting, the patterning structures 105 may be made from any known hardmask material, e.g., oxide, silicon, C, silicon nitride, and the like. In some embodiments, the patterning structures 105 may include a photoresist layer 114 atop a patterning film 116.

Figure 2A:
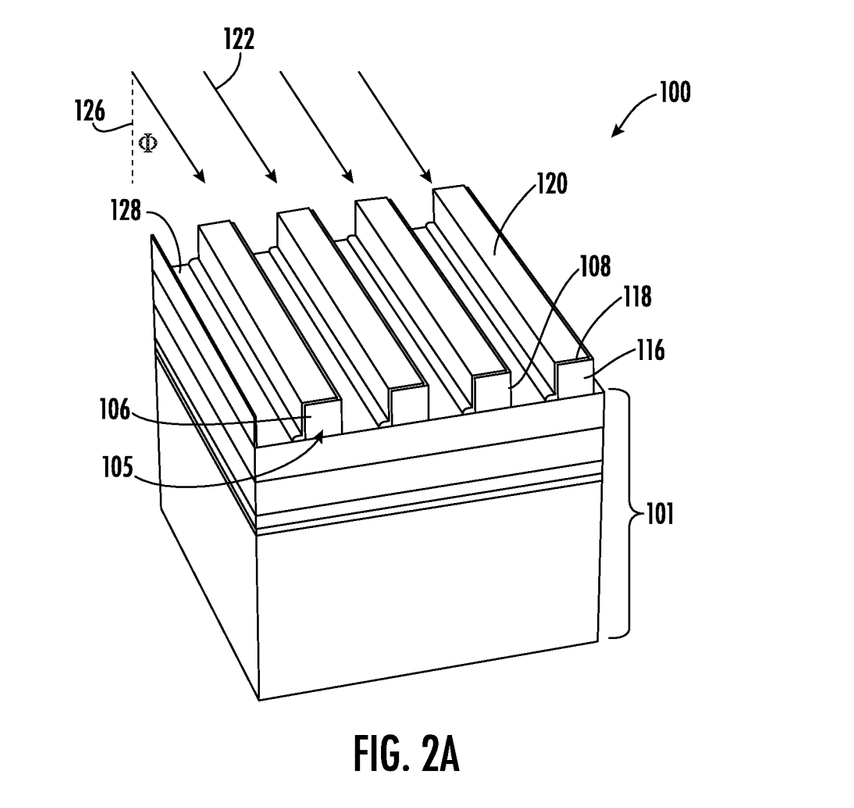
FIG. 2A is a perspective view of a device during formation of a seed layer according to embodiments of the present disclosure.
Figure 2B:
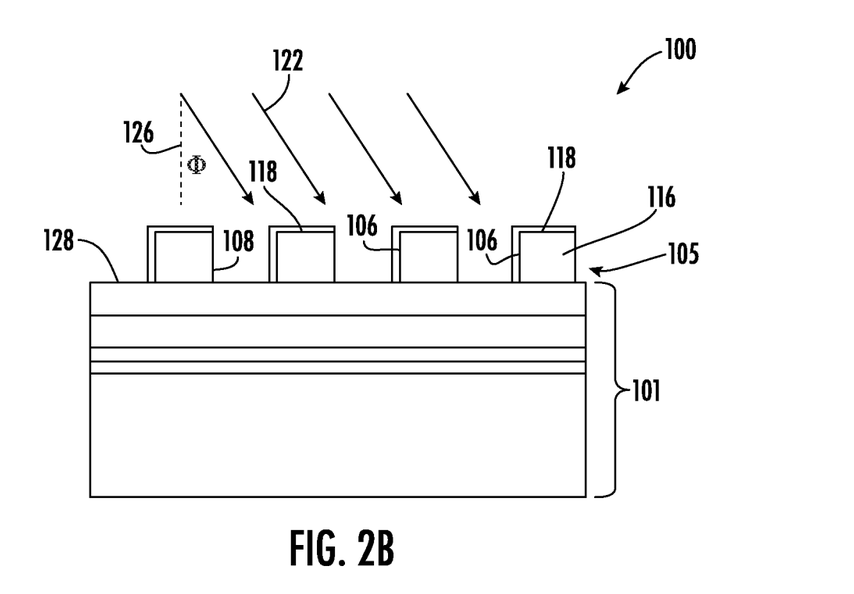
FIG. 2B is a side view of the device of FIG. 2A according to embodiments of the present disclosure.

As shown in FIGS. 2A-2B, the photoresist layer 114 is removed selective to an upper surface 118 of the patterning film 116 of each patterning structure 105. A seed layer 120 may then be formed over the patterning structures 105. In some embodiments, the seed layer 120 may be formed by a directional mask deposition process 122, wherein a seed material (e.g., a metal layer, such as copper, cobalt, nickel, gold, silver, manganese, tin, aluminum, ruthenium, and alloys thereof) may be delivered to the device 100 at a non-zero angle of inclination $\phi$ relative to a perpendicular 126 to a top surface 128 of the device layer 102. In some embodiments, the non-zero angle of inclination may be selected so that the seed material impacts just the first sidewall 106 and the upper surface 118 of each of the patterning structures 105. The seed layer 120 generally does not form along the second sidewall 108 of each of the patterning structures 105. As shown, the top surface 128 between each of the patterning structures 105 is generally unaffected by the directional mask deposition process 122. Said another way, the seed material is prevented from forming along the top surface 128 of the device layer 102 in an area directly adjacent the second sidewall 108 of each of the patterning structures 105.

Figure 3A:
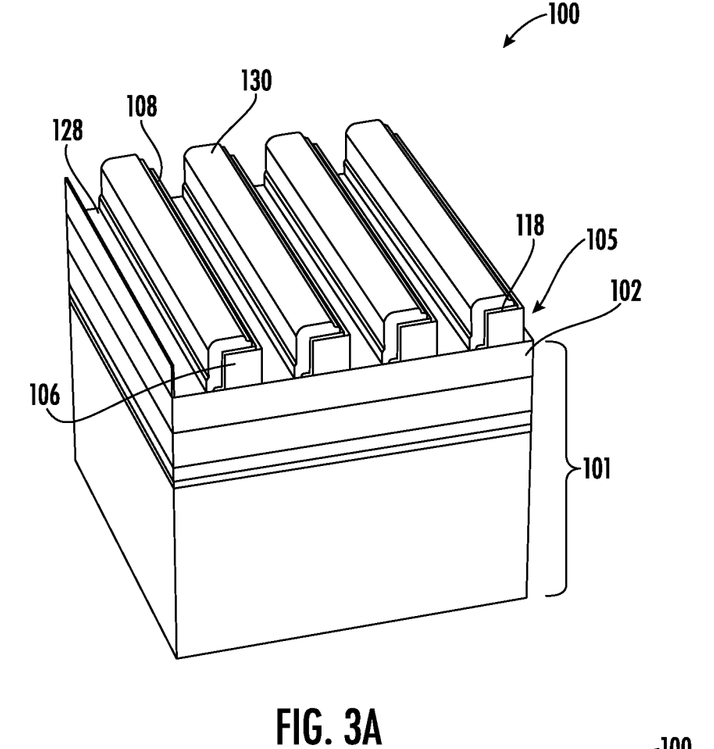
FIG. 3A is a perspective view of a device during formation of a metal layer according to embodiments of the present disclosure.
Figure 3B:
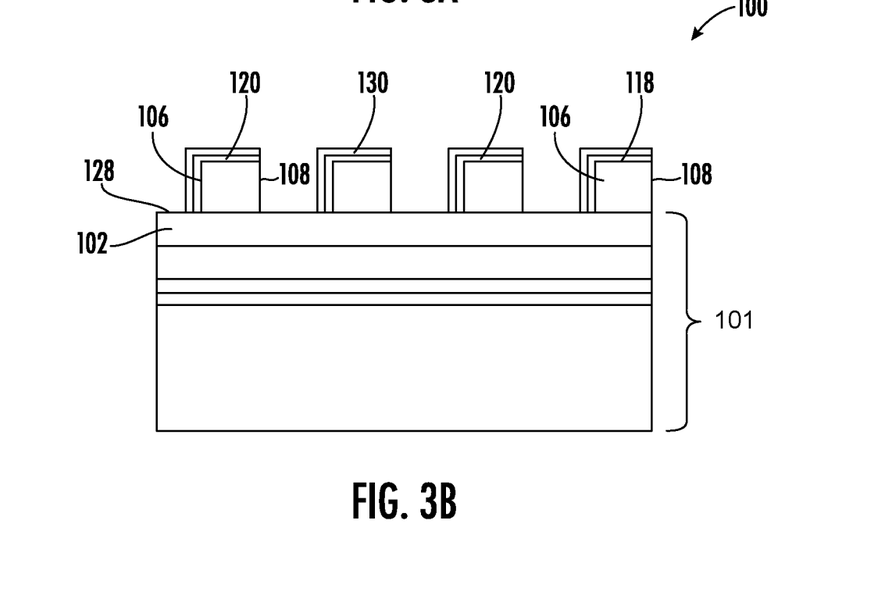
FIG. 3B is a side view of the device of FIG. 3A according to embodiments of the present disclosure.

As shown in FIGS. 3A-3B, a metal layer 130 may be formed along the first sidewall 106 and the upper surface 118 of each of the patterning structures 105. More specifically, the metal layer 130 may be formed atop each of the seed layers 120. As shown, the metal layer 130 may not be formed along the second sidewall 108 of each of the patterning structures 105. In some embodiments, the metal layers 130 may be formed by a selective atomic layer deposition (ALD) process. In other embodiments, the metal layers 130 may be formed by a chemical vapor deposition (CVD) process or electrochemical deposition. As shown, each metal layer 130 generally extends down to the top surface 128 of the device layer 102. Although non-limiting, the metal layer may be ruthenium (Ru), cobalt (Co), molybdenum (Mo), or tungsten (W).

Figure 4:
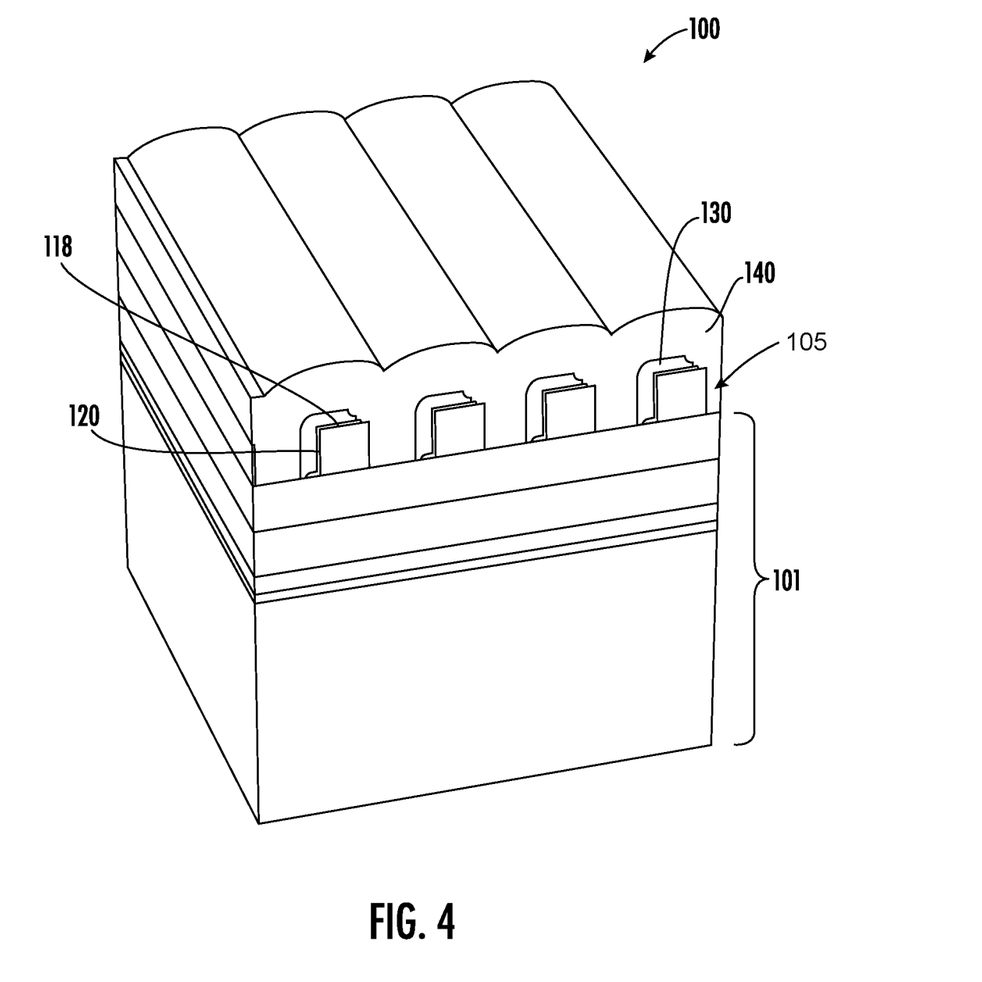
FIG. 4 is a side cross-sectional view of a fill material formed over the device according to embodiments of the present disclosure.
Figure 5:
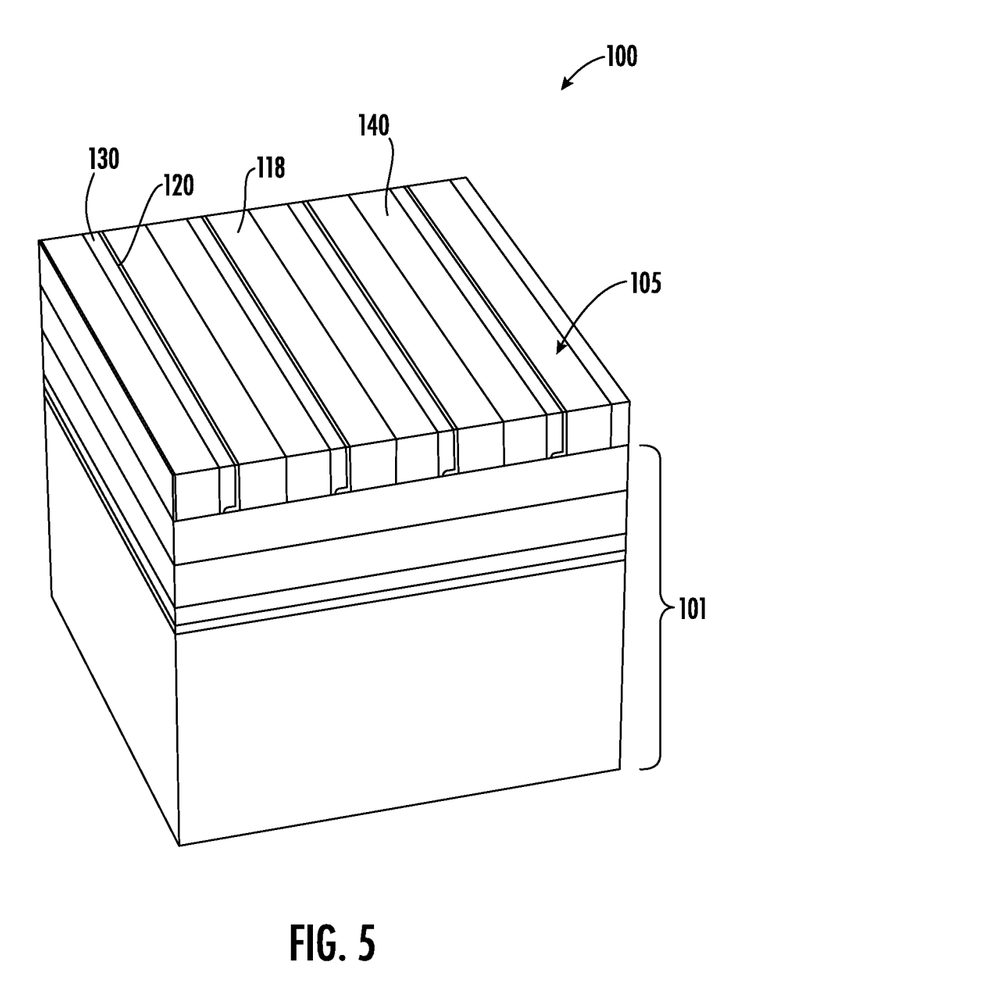
FIG. 5 is a side cross-sectional view of the device following a planarization process according to embodiments of the present disclosure.

Next, as shown in FIG. 4, a fill material 140 may be formed over the device 100, including between each of the patterning structures 105, and then planarized, as shown in FIG. 5. In some embodiments, the fill material 140 may be planarized selective to the upper surface 118 of the patterning structures 105. As shown, the metal layer 130 and the seed layer 120 may also be removed from the upper surface 118 of each of the patterning structures 105. In some embodiments, the metal layer 130 and the seed layer 120 remain only along the first sidewall 106 of each of the patterning structures 105. In some embodiments, the planarization process may be a CMP and/or etch. Although non-limiting, the fill material 140 may be a gap fill oxide or nitride.

Figure 6A:
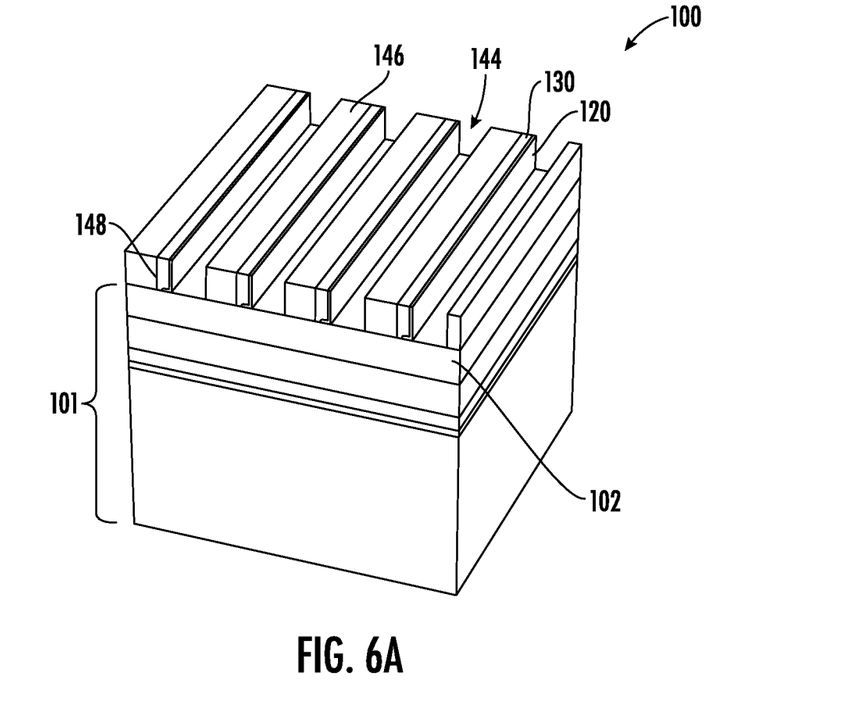
FIG. 6A is a perspective view of a device following removal of a plurality of patterning structures according to embodiments of the present disclosure.
Figure 6B:
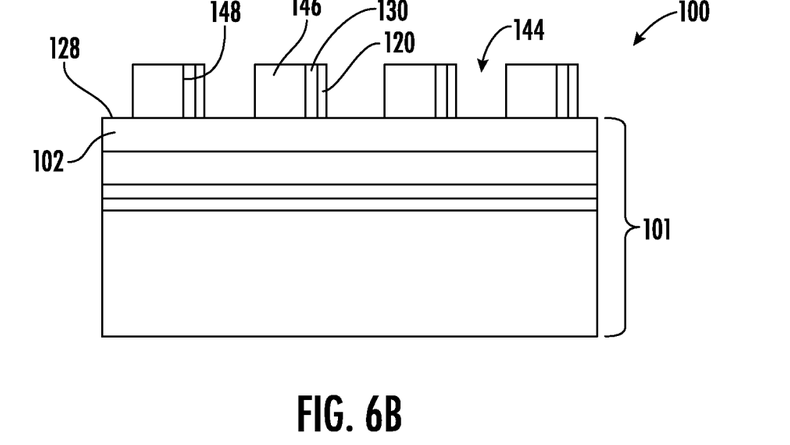
FIG. 6B is a side view of the device of FIG. 6A according to embodiments of the present disclosure.

Next, as shown in FIGS. 6A-6B, the patterning structures 105 may be removed from the device 100 to form a set of trenches 144 and a plurality of fill structures 146. In some embodiments, the patterning structures 105 may be removed selective to the top surface 128 of the device layer 102 of the patterning stack 101 using, e.g., a wet etch process. The metal layers 130 and the seed layers 120 may remain. As shown, the metal layers 130 and the seed layers 120 are present along just one sidewall 148 of each of the plurality of fill structures 146.

Figure 7:
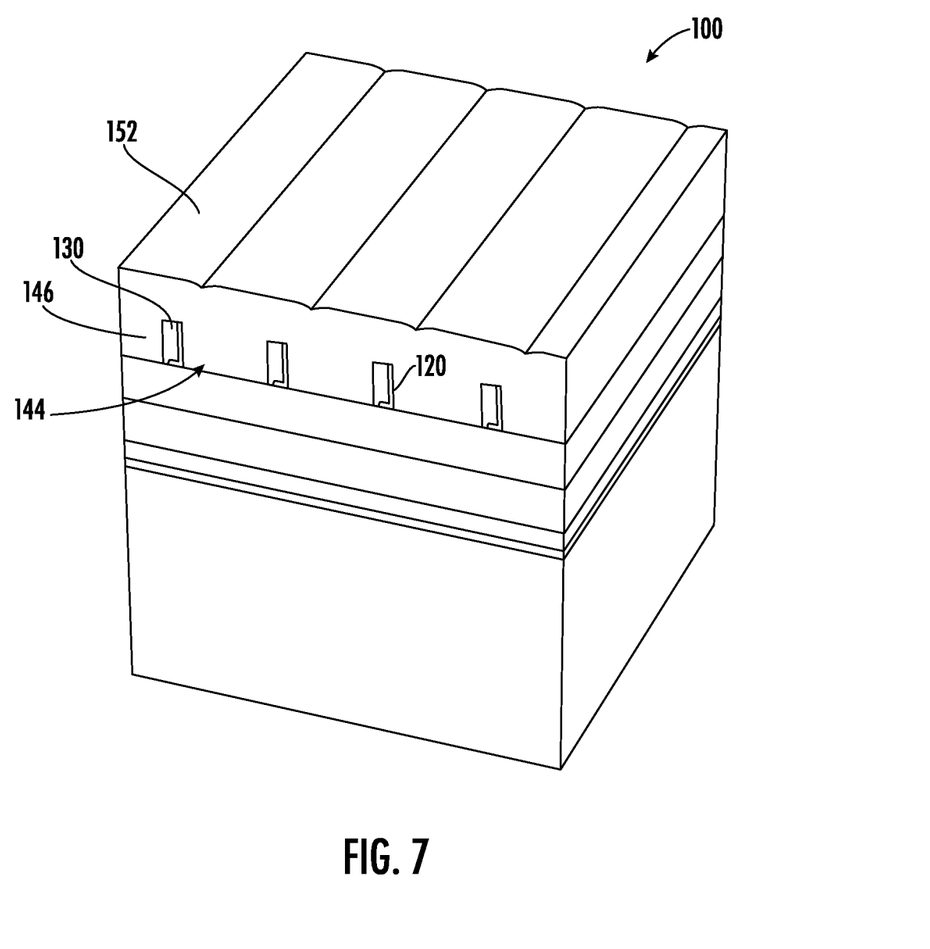
FIG. 7 is a side cross-sectional view of a second fill material formed over the device according to embodiments of the present disclosure.

Next, as shown in FIG. 7, a second fill material 152 may be formed over the device 100, including over the plurality of fill structures 146 and within the set of trenches 144. In some embodiments, the second fill material 152 may be gap fill oxide or nitride, which is planarized (not shown) to a same height or thickness as the metal layers 130 and the seed layers 120.

Figure 8:
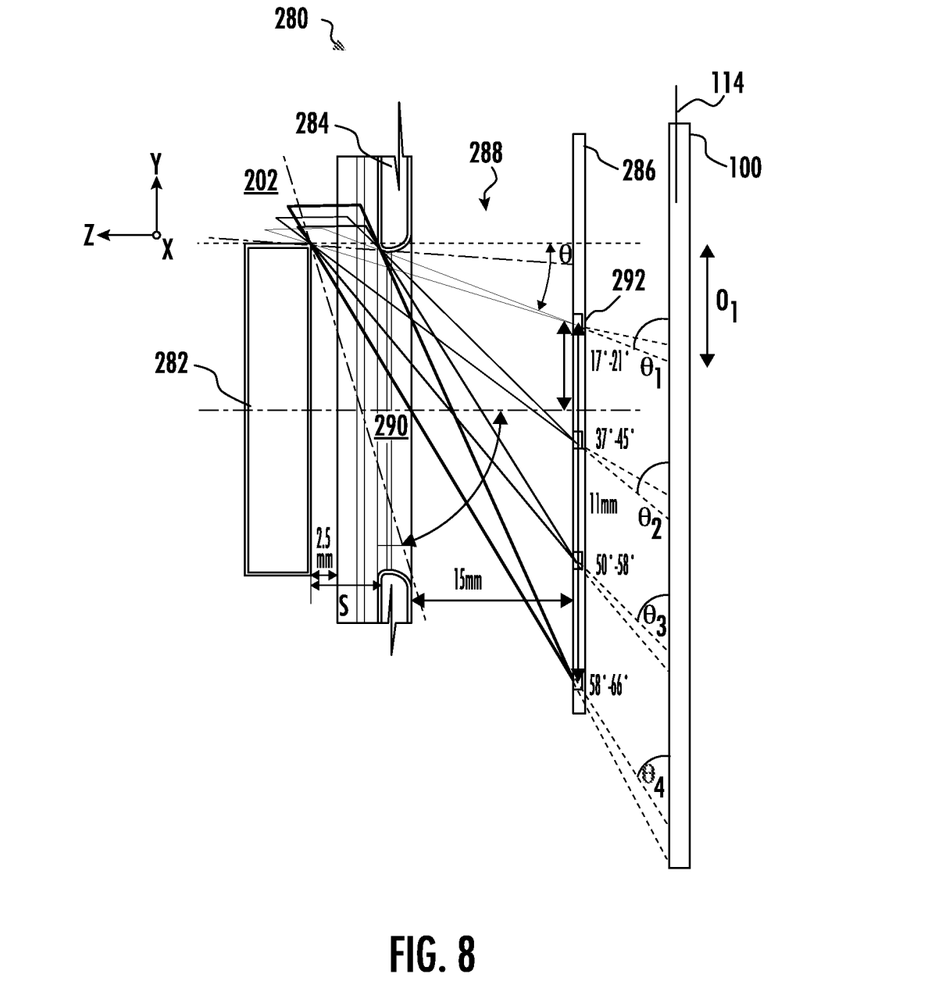
FIG. 8 illustrates a schematic diagram of an extraction assembly according to embodiments of the present disclosure.

FIG. 8 shows a side view of another apparatus according to embodiments of the disclosure. As shown, an extraction assembly 280 may be coupled to the plasma chamber 202, and include an extraction plate 284 and a beam blocker 282. The extraction assembly 280 may further include a collimation plate 286, disposed between the extraction plate 284 and device layer 102. Extraction of an ion beam may be achieved by a bias voltage applied between the plasma chamber 202 and device layer 102, depending upon the targeted ion energy. To generate an angled ion beam, the beam blocker 282 may be arranged to block a portion of the aperture 290, formed with the extraction plate 284, so that an ion beam 288 is extracted from the plasma chamber 202 along the edge of the aperture as shown.

Notably, ions may exit the plasma chamber 202 over a range of angles. To select for a given angle of incidence (or narrow range of angles of incidence) ($\theta$), the collimation plate 286 may be provided with a collimation aperture 292 arranged at a specific offset O with respect to an edge of the aperture 290. FIG. 8 illustrates four possible placements for the collimation aperture 292. Increasing the value of O will lead to a higher value of $\theta$. In FIG. 8, for an offset O1, the corresponding q1 is 17-21 degrees. Larger offsets will produce larger angles of incidence. Thus, for a given placement of the collimation aperture 292, ions exiting the plasma chamber 202 will be blocked from traversing to the device layer 102, except those ions having the suitable angle of incidence to pass through the collimation aperture 292 and strike the device layer 102. Thus, by switching between different collimation plates having different value of O, the apparatus of FIG. 8 presents a convenient means to vary the angle of incidence of ions of a reactive beam to be applied to a substrate to change the coverage of the selective seed layer 120 on the patterning structures 105, as generally shown in FIGS. 1 and 3B.

It is to be understood that the various layers, structures, and regions shown in the accompanying drawings are schematic illustrations. For ease of explanation, one or more layers, structures, and regions of a type commonly used to form semiconductor devices or structures may not be explicitly shown in a given drawing. This does not imply that any layers, structures, and/or regions not explicitly shown are omitted from the actual semiconductor structures.

In various embodiments, design tools can be provided and configured to create the datasets used to pattern the semiconductor layers of the device 100, e.g., as described herein. For example, data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance running software, or implemented in hardware.

As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading the Detailed Description, the various features and functionality described herein may be implemented in any given application and can be implemented in one or more separate or shared modules in various combinations and permutations. Although various features or elements of functionality may be individually described or claimed as separate modules, one of ordinary skill in the art will understand these features and functionality can be shared among one or more common software and hardware elements.

For the sake of convenience and clarity, terms such as "top," "bottom," "upper," "lower," "vertical," "horizontal," "lateral," and "longitudinal" will be understood as describing the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

As used herein, "depositing" and/or "deposited" may include any now known or later developed techniques appropriate for the material to be deposited including yet not limited to, for example: chemical vapor deposition (CVD), low-pressure CVD (LPCVD), and plasma-enhanced CVD (PECVD). Additional techniques may include semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), and sputtering deposition. Additional techniques may include ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A method, comprising:
   providing a semiconductor device including plurality of patterning structures over a device stack, each of the plurality of patterning structures including a first sidewall, a second sidewall, and an upper surface;
   forming a seed layer along just the first sidewall and the upper surface of each of the plurality of patterning structures;
   forming a metal layer atop the seed layer;
   forming a fill material between each of the plurality of patterning structures; and
   removing the plurality of patterning structures.

2. The method of claim 1, further comprising forming a second fill material over the metal layer.

3. The method of claim 1, further comprising planarizing the semiconductor device before removing the plurality of patterning structures.

4. The method of claim 3, wherein the planarizing the semiconductor device further comprises removing the seed layer and the metal layer from the upper surface of each of the plurality of patterning structures.

5. The method of claim 4, wherein the seed layer and the metal layer remain along the first sidewall of each of the plurality of patterning features after the semiconductor device is planarized.

6. The method of claim 1, wherein the forming the seed layer comprises depositing a seed material at a non-zero angle of inclination relative to a perpendicular to a plane defined by a top surface of the device stack.

7. The method of claim 1, wherein the forming the metal layer comprises selectively forming the metal layer over just the first sidewall and the upper surface of each of the plurality of patterning structures.

8. The method of claim 1, further comprising selectively forming the metal layer by an atomic layer deposition process.

9. The method of claim 1, further comprising preventing the metal layer from being formed along the second sidewall of each of the plurality of patterning structures.

10. A method of forming a semiconductor device, comprising:
    providing a plurality of patterning structures over a device stack, each of the plurality of patterning structures including a first sidewall, a second sidewall, and an upper surface;
    forming a seed layer along just the first sidewall and the upper surface of each of the plurality of patterning structures;
    forming a metal layer atop just the seed layer;

forming a fill material over the plurality of patterning structures and the device stack; and planarizing the fill material, the metal layer, and the seed layer to remove the metal layer and the seed layer from the upper surface of each of the plurality of patterning structures.

11. The method of claim 10, further comprising removing the plurality of patterning structures to form a plurality of fill structures, wherein the metal layer and the seed layer are present along just one sidewall of each of the plurality of fill structures.

12. The method of claim 11, further comprising forming a second fill material over the plurality of fill structures.

13. The method of claim 10, wherein the seed layer and the metal layer remain along the first sidewall of each of the plurality of patterning features after the fill material, the metal layer, and the seed layer are planarized.

14. The method of claim 10, wherein the forming the seed layer comprises depositing a seed material at a non-zero angle of inclination relative to a perpendicular to a plane defined by a top surface of the device stack.

15. The method of claim 10, wherein the forming the metal layer comprises selectively forming the metal layer over just the first sidewall and the upper surface of each of the plurality of patterning structures.

16. A metal line patterning method, comprising:
providing a semiconductor device including a plurality of patterning structures over a device stack, each of the plurality of patterning structures including a first sidewall, a second sidewall, and an upper surface;

forming a metal layer and a seed layer over each of the plurality of patterning structures;

planarizing a metal layer and a seed layer to remove the metal layer and the seed layer from the upper surface of each of the plurality of patterning structures; and removing the plurality of patterning structures to form a plurality of fill structures, wherein the metal layer and the seed layer are present along just one sidewall of each of the plurality of fill structures.

17. The metal line patterning method of claim 16, further comprising:

forming the seed layer along just the first sidewall and the upper surface of each of the plurality of patterning structures;

forming the metal layer atop just the seed layer; and forming a fill material over the plurality of patterning structures and the device stack, wherein the fill material is planarized together with the metal layer and the seed layer.

18. The metal line patterning method of claim 16, further comprising forming a second fill material over the plurality of fill structures.

19. The metal line patterning method of claim 16, wherein forming the seed layer comprises depositing a seed material at a non-zero angle of inclination relative to a perpendicular to a plane defined by a top surface of the device stack.

20. The metal line patterning method of claim 16, wherein forming the metal layer comprises selectively forming the metal layer over just the first sidewall and the upper surface of each of the plurality of patterning structures.

* * * * *